United States Patent [19]

Stansbury

[11] Patent Number: 5,760,470

[45] Date of Patent: Jun. 2, 1998

[54] MULTI-LAYER ELECTRICAL INTERCONNECTION STRUCTURES

[75] Inventor: Darryl M. Stansbury, Boise, Id.

[73] Assignee: Micron Display Technology, Inc., Boise, Id.

[21] Appl. No.: 447,747

[22] Filed: May 23, 1995

Related U.S. Application Data

[62] Division of Ser. No. 386,644, Feb. 10, 1995, Pat. No. 5,612,256.

[51] Int. Cl.$^6$ .................... H01L 23/48; H01L 23/52
[52] U.S. Cl. .................................... 257/690; 257/784
[58] Field of Search .................... 257/700, 690, 257/778, 784, 782, 780

[56] References Cited

U.S. PATENT DOCUMENTS

| | | | |
|---|---|---|---|
| 4,387,283 | 6/1983 | Peterson et al. | |
| 4,423,435 | 12/1983 | Test, II | 437/218 |
| 4,769,345 | 9/1988 | Butt et al. | 437/218 |
| 4,857,161 | 8/1989 | Borel et al. | |
| 4,857,799 | 8/1989 | Spindt et al. | |
| 4,923,421 | 5/1990 | Brodie et al. | |
| 5,010,038 | 4/1991 | Fox et al. | 437/215 |
| 5,015,912 | 5/1991 | Spindt et al. | |
| 5,056,702 | 10/1991 | Nakahashi et al. | 437/218 |
| 5,063,327 | 11/1991 | Bodie et al. | |
| 5,075,591 | 12/1991 | Holmberg | |
| 5,081,067 | 1/1992 | Shimizu et al. | 437/215 |
| 5,140,219 | 8/1992 | Kane | |
| 5,151,061 | 9/1992 | Sandhu | |
| 5,157,304 | 10/1992 | Kane et al. | |
| 5,217,922 | 6/1993 | Akasaki et al. | 437/215 |
| 5,249,732 | 10/1993 | Thomas | |
| 5,250,847 | 10/1993 | Baskett | 257/778 |
| 5,258,330 | 11/1993 | Khandros et al. | 437/215 |
| 5,347,428 | 9/1994 | Carson et al. | 361/760 |
| 5,381,039 | 1/1995 | Morrison | |
| 5,414,298 | 5/1995 | Grube et al. | 257/690 |

OTHER PUBLICATIONS

IBM Technical Disclosure, "Direct Chip Bonding For Liquid Crystal Display", vol. 34, No. 5, Oct. 1991 pp. 183–184.

Montgomery, Clive Richard, "Flip Chip Asemblies Using Conventional Wire Bonding Apparatus And Commerically Available Dies", ISHM '93 Proceedings, pp. 451–456 no month.

"Liquid Crystal Display Products", Product Brochure, Standish LCD, Division of Standish Industries, Inc., pp. 5–6, no date.

"Process–Stabilized Extrude Bonding Wire and Ribbon", Product Brochure, Hydrostatics Inc., Bethlehem PA, (Jun. 1991).

(List continued on next page.)

*Primary Examiner*—Mahshid D. Saadat
*Assistant Examiner*—S. V. Clark
*Attorney, Agent, or Firm*—Wells, St. John, Roberts, Gregory & Matkin, P.S.

[57] ABSTRACT

A flat-panel field emission display comprises a luminescent faceplate, a rigid backplate, and an interposed or sandwiched emitter or cathode plate. A dielectric connector ridge is screen-printed over the faceplate's rear surface. Upper and lower level conductors are then screen printed over the faceplate. The lower-level conductors are applied directly on the faceplate rear surface. The upper-level conductors are applied atop the connector ridge. A plurality of bond wire interconnections extend between individual screen-printed conductors of the upper and lower levels. The bond wire interconnections create inter-level electrical interconnections between said individual screen-printed conductors. The cathode plate is positioned over the connector ridge. The cathode plate has a plurality of die bond pads facing the faceplate rear surface and aligned with the upper-level conductors. A plurality of conductive bonds such as flip-chip connections are positioned between the die bond pads and the facing upper-level conductors.

12 Claims, 12 Drawing Sheets

OTHER PUBLICATIONS

Kondoh, You et al. "A Subminiature CCD Module Using a New Assembly Technique", IEICE Transactions, vol. E 74, No. 8 Aug. 1991.

Cohen, I.M. et al. "Ball Formation Processes in Aluminum Bonding Wire", Solid State Technology, pp. 89–92, Dec. 1985.

Levy, F. et al. "Phosphors for Full Color Microtips Fluorescent Displays", pp. 20–23, IEEE, 1991. no month.

Kang, Sa-Yoon et al. Physical and Fuzzy Logic Modeling of a Flip–Chip Thermocompression Bonding Process, Journal of Electronic Packaging, pp. 63–70, Mar. 1993.

Charles, Jr., H.K. "Electronic Materials Handbook –vol. 1 Packaging", Product Brochure, ASM International no date.

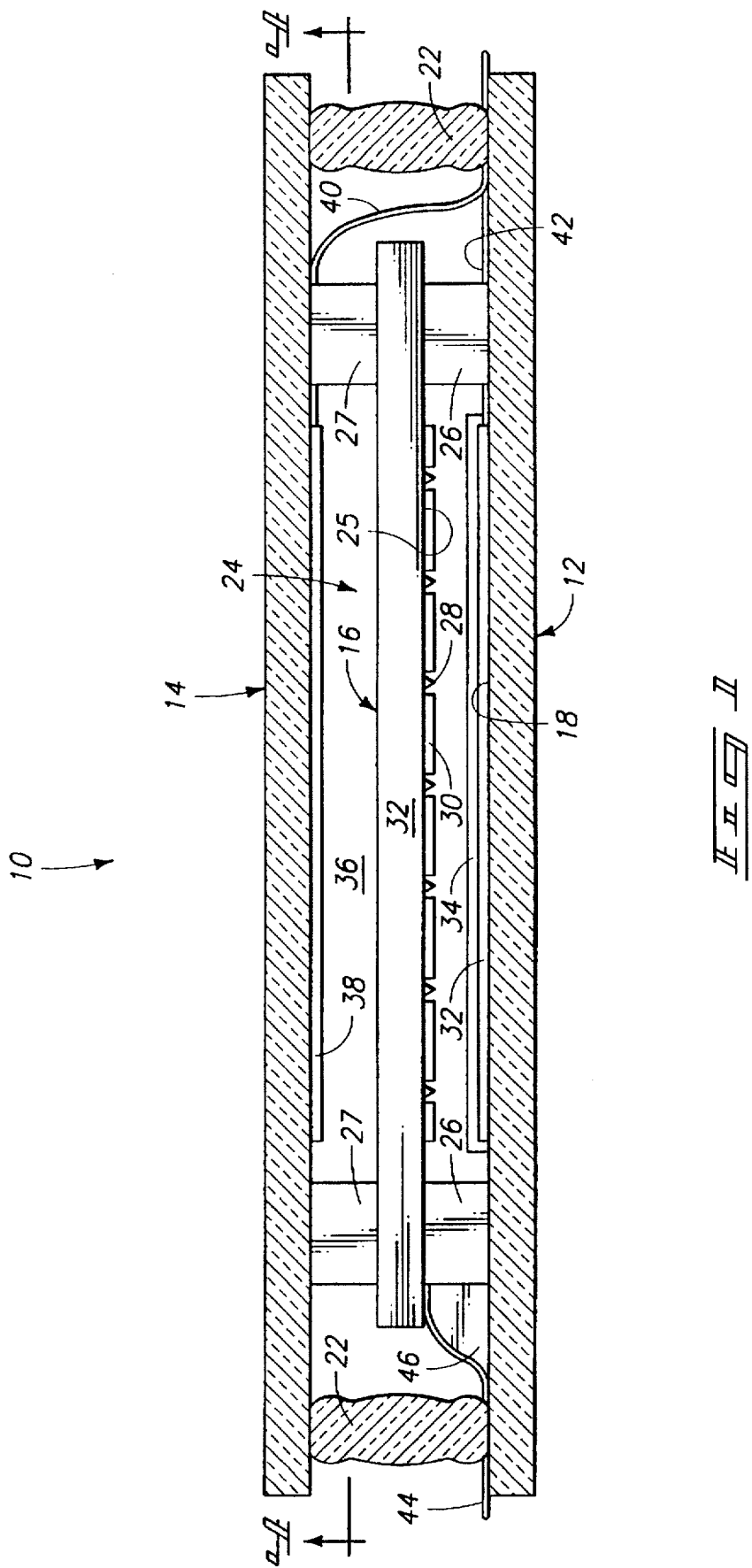

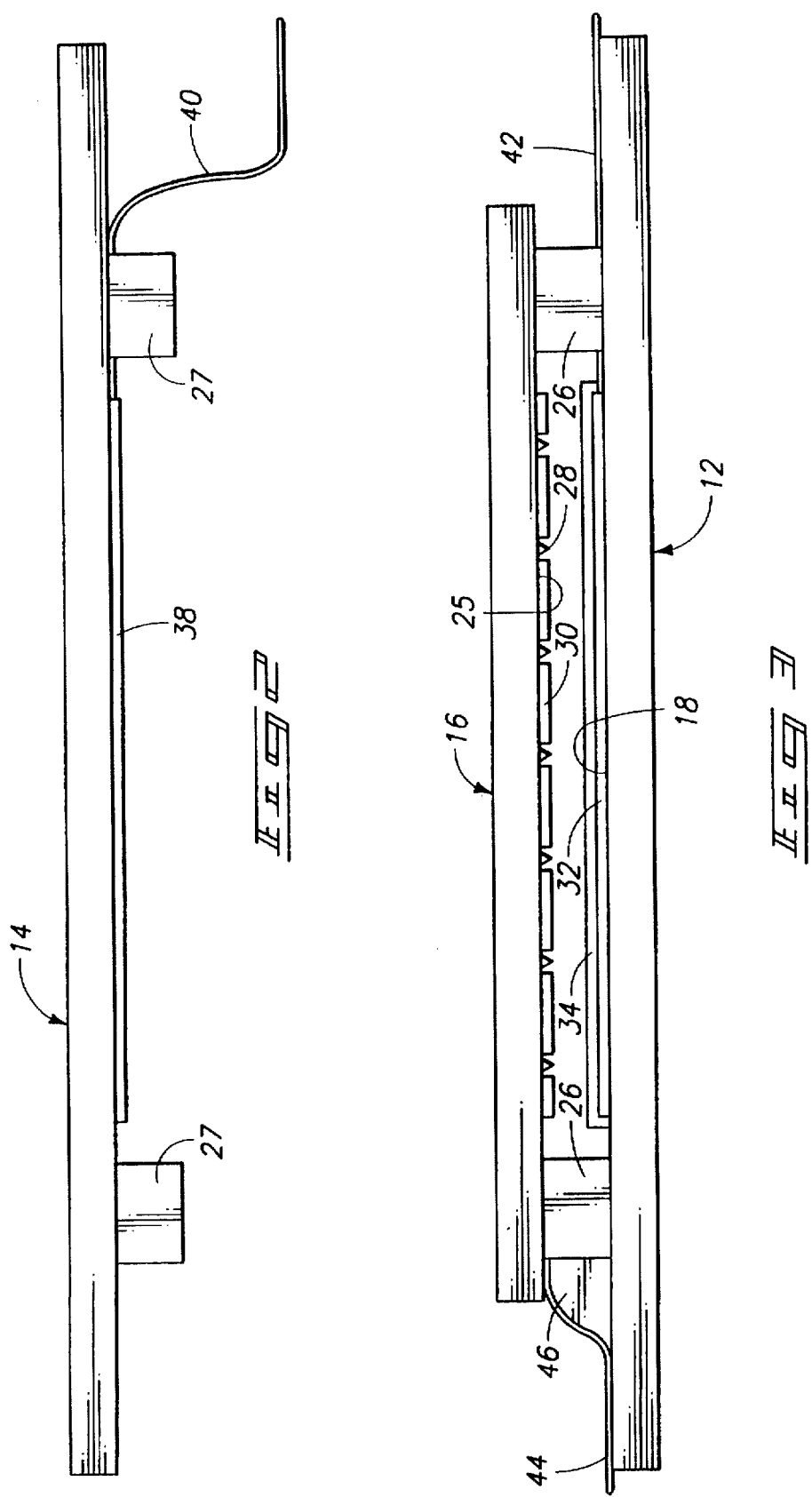

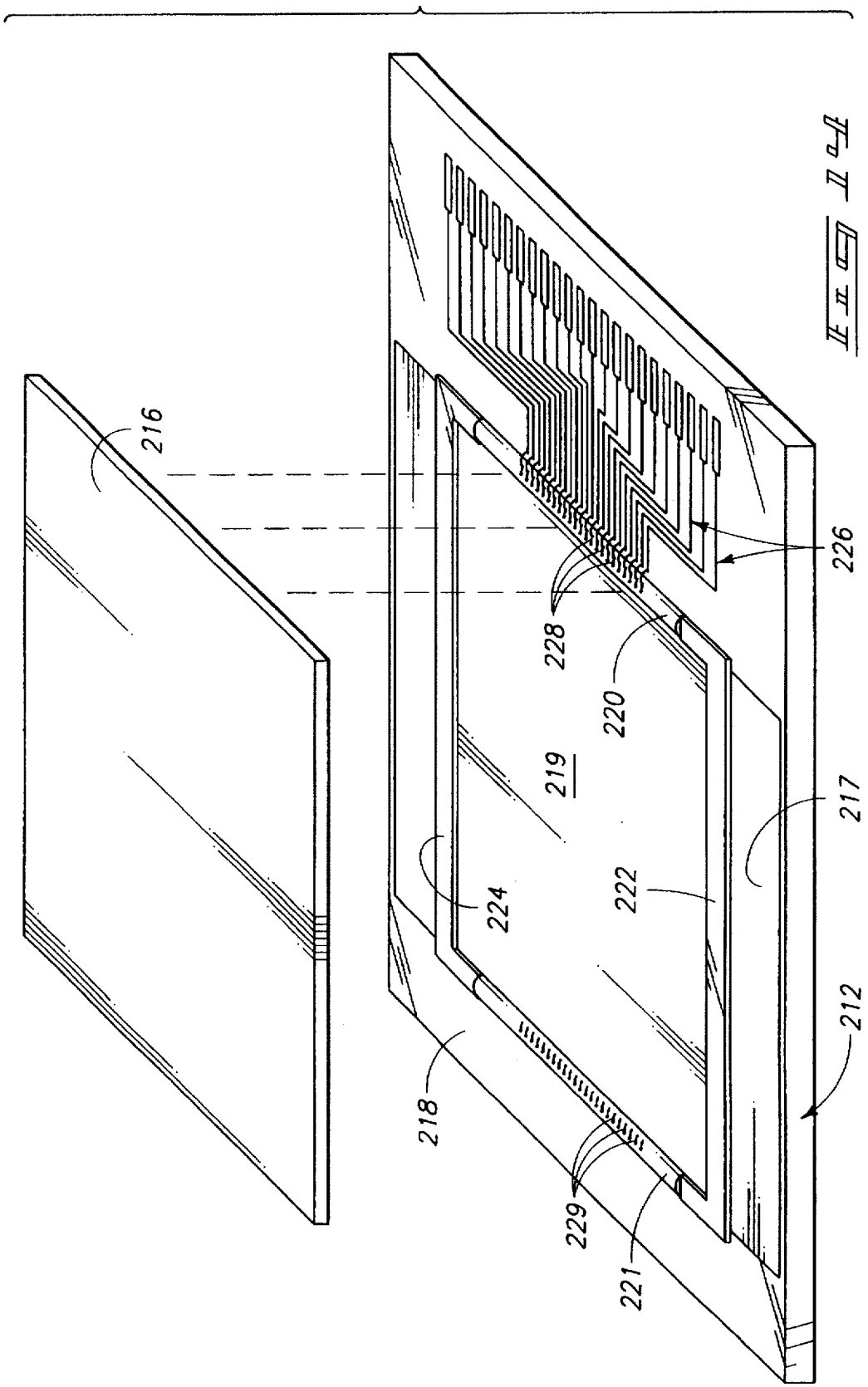

MULTI-LAYER ELECTRICAL INTERCONNECTION STRUCTURES

RELATED PATENT DATA

This patent resulted from a divisional application of U.S. patent application Ser. No. 08/386,644, filed on Feb. 10, 1995, now U.S. Pat. No. 5,612,256, entitled "Multi-Layer Electrical Interconnection Structures And Fabrication Methods" listing the inventor as Darryl M. Stansbury.

TECHNICAL FIELD

This invention relates to interconnection structures and methods for multi-layer screen-printed semiconductor circuits.

BACKGROUND OF THE INVENTION

The preferred embodiment of the invention includes connection structures and methods which are described below in the context of a field emission flat-panel display. Such a flat-panel display is also described in two concurrently-filed applications, both assigned to Micron Display Technology, Inc., entitled "Internal Plate Flat-Panel Field Emission Display" and "Methods of Mechanical and Electrical Substrate Connection," the disclosures of which are hereby incorporated by reference. The structures and methods described and claimed herein are particularly useful in conjunction with a flat-panel display. They will also find advantageous application in the context of other circuits employing conductors which are screen-printed on multiple levels. The structures and methods of the invention are especially advantageous in environments in which a substrate is to be mounted, face down, over elevated conductors which must, in turn, be connected to conductors at a lower level. Electrical connections between the elevated conductors and the lower-level conductors are conventionally made with "via" technology. The invention described below, however, eliminates the need for via conductors in many situations. This reduces the complexity of the resulting structure and simplifies its fabrication.

BRIEF DESCRIPTION OF THE DRAWINGS

FIG. 1 is a diagrammatic sectional view of a field emission flat-panel display.

FIG. 2 is an end view which shows a subassembly of the flat-panel display of FIG. 1 The subassembly includes a backplate and rear positioning spacers.

FIG. 3 is an end view which shows a subassembly of the flat-panel display of FIG. 1. This subassembly includes a faceplate and an attached silicon cathode plate.

FIG. 11 is a partial cross-sectional view of a multi-level interconnect structure.

FIG. 12 shows a preferred manner of forming faceplate conductors.

FIG. 14 is a simplified exploded perspective view of an alternative embodiment subassembly which includes a faceplate and a silicon cathode plate.

DETAILED DESCRIPTION OF THE PREFERRED EMBODIMENTS

Figure 4:
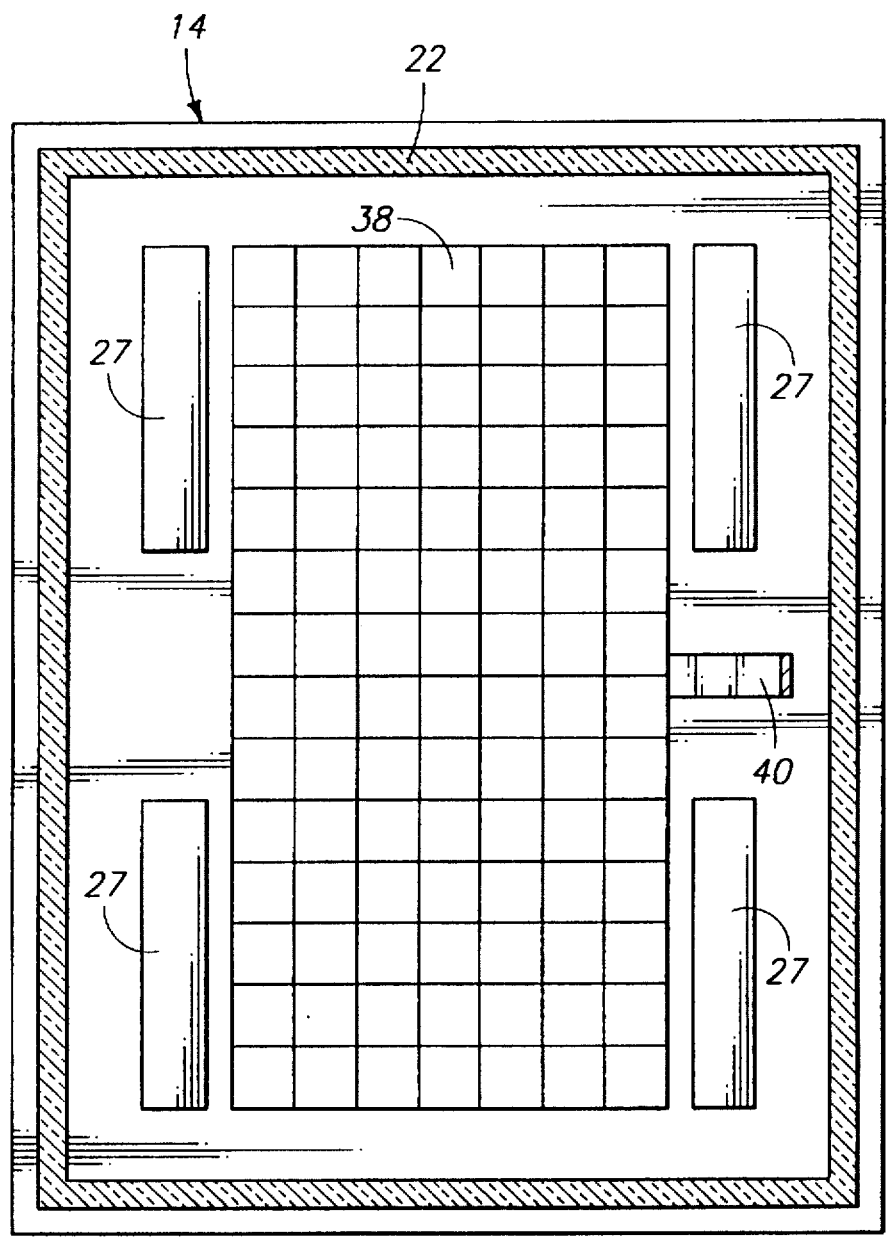
FIG. 4 is a reduced scale bottom view of the backplate shown in FIG. 2.

This disclosure of the invention is submitted in furtherance of the constitutional purposes of the U.S. Patent Laws "to promote the progress of science and useful arts." U.S. Constitution, Article 1, Section 8.

FIGS. 1–4 show components of a flat-panel field emission display 10. It is to be understood that the drawings are not to scale. They have been simplified to illustrate the novel features of the invention and its constituent parts.

Flat-panel display 10 generally includes a transparent faceplate 12, a backplate 14, and a cathode plate 16 positioned between faceplate 12 and backplate 14. Faceplate 12 is made from glass to form a rigid and planar dielectric substrate to which cathode plate 16 is mounted as described below. It has a rear surface 18 which is luminescent in response to impinging electrons. Backplate 14 is likewise made from glass in a rigid and planar form.

Backplate 14 is spaced rearwardly behind transparent faceplate 12 by a peripheral spacer 22 (FIG. 1). Peripheral spacer 22 extends between faceplate 12 and backplate 14 in a continuous path around the entire periphery of backplate 14 and faceplate 12. Peripheral spacer 22 also functions as a seal. Faceplate 12, backplate 14, and peripheral spacer 22 define an evacuated space 24 which contains cathode plate 16.

Cathode plate 16 is positioned over and mounted to transparent faceplate 12 at a spaced distance from faceplate rear surface 18. More specifically, cathode plate 16 has a front emitter surface 25 positioned rearwardly adjacent and facing rear surface 18 of faceplate 12. The desired spacing between faceplate rear surface 18 and cathode plate front emitter surface 25 is established and maintained by one or more front positioning spacers 26 which are formed on rear surface 18 of faceplate 12. Front positioning spacers 26 are interposed between faceplate 12 and cathode plate 16 to space front emitter surface 25 rearwardly from faceplate rear surface 18. Cathode plate 16 is positioned behind and against front positioning spacers 26.

Cathode plate 16 comprises a semiconductor die formed of a silicon substrate. An emitter matrix is formed on front emitter surface 25 of cathode plate 16, facing faceplate rear surface 18. The emitter matrix comprises a plurality of field emission devices formed on the front emitter surface 25 of the silicon substrate. Each field emission device is a small emitter tip, electrode, or cathode 28 surrounded by a gate structure. The gate structures of cathode plate 16 are symbolically represented in FIGS. 1 and 3, designated by the reference numeral 30. Gate structures 30 control the electron emission of electrodes 28 in response to externally-supplied control signals. The emitter tips 28 and gate structures 30 are produced on cathode plate 16 by well-known thin film processes. Cathode plate 16 is alternatively referred to as an electrode plate or an emitter plate.

The field emitter devices included within the emitter matrix of cathode plate 16 are directed toward faceplate rear surface 18. Rear surface 18 includes a cathodoluminescent area which preferably is coated with a luminescent material, such as a phosphor coating or screen 32, and an overlying aluminum coating 34. The phosphor screen produced on the faceplate rear surface 18 is preferably aluminized. Alternatively, a transparent conductive film is applied to rear surface 18 prior to providing the phosphor coating.

The cathodoluminescent area of faceplate rear surface 18 is arranged coincidental with the operational area of the field emitter devices included in the emitter matrix of cathode plate 16. Emitter tips 28 emit electrons which are drawn toward rear surface 18 by a high differential voltage between emitter tips 28 and phosphor screen 32 in accordance with known operational characteristics of field emission displays.

Backplate 14 is spaced behind cathode plate 16 by peripheral spacer 22. In addition, one or more rear positioning spacers 27 are interposed between backplate 14 and cathode plate 16. Rear positioning spacers 27, in conjunction with front positioning spacers 26, mount cathode plate 16 at the correct position between backplate 14 and transparent faceplate 12. The spaces between backplate 14 and cathode plate 16 and between faceplate 12 and cathode plate 16 are evacuated, creating a rearward vacuum space 36 behind cathode plate 16 and a forward vacuum space 37 in front of cathode plate 16.

Flat-panel display 10 has a getter 38 positioned in rearward vacuum space 36, preferably on the forward surface of backplate 14. Getter 38 can be in the form of wires or plates of conventional getter material for chemically combining with gaseous materials produced during operation of the display. The material used to form getter 38 can be applied using any appropriate technique, including electrophoresis, screen printing, electrostatic deposition or fabrication of getter wire.

Getter 38 is illustrated as being mounted to the forward surface of backplate 14 behind cathode plate 16. If desired, it could alternatively be located on the back surface of cathode plate 16 or at other positions in the rearward vacuum space. Conductive leads 40, leading to getter 38, are sealed to the rearward surface of faceplate 12 and extend beneath peripheral seal 22, as shown in FIG. 1.

In general, the steps involved in producing the packaged display include initially forming a subassembly comprising faceplate 12 and cathode plate 16. Initially, faceplate 12 is prepared by forming front positioning spacers 26 on rear surface 18. Spacers 26 are preferably stenciled or screen-printed on rear surface 18 using conventional thick-film, multi-layer technology and a dielectric material such as a glass frit. The term "thick-film" is used to designate screen printing and firing processes which result in layers having thicknesses in the range of greater than five microns.

The glass frit used is preferably a devitrifying frit, which adheres to a glass substrate at its softening temperature but remelts at a higher temperature. It can be applied within the openings of a stencil (not shown) in the form of a paste produced by combining the glass frit with a solvent (such as pine oil). After applying the paste containing glass frit to faceplate rear surface 18, faceplate 12 is heated to a firing temperature to produce solid glass spacers of the desired shape and thickness, as determined by the stencil or other selected application method. The thickness of spacers 26 is selected to provide the appropriate spacing between faceplate 12 and cathode plate 16, and to maintain cathode plate 16 in a parallel relationship with faceplate 12.

Conductive leads 42, leading eventually to phosphor screen 32, are bonded to faceplate rear surface 18. In addition, a plurality of conductive traces or faceplate terminal conductors 44 are applied over rear surface 18 and one of front spacers 26 for contact with corresponding conductors of cathode plate 16. Further details and preferred alternatives regarding the connection between faceplate terminal conductors 44 and cathode plate 16 will be set forth below. However, faceplate conductors 44 could in some cases be formed as shown in FIGS. 1 and 3 over a ramped spacer 46 after firing of the spacers 26 and 46, and prior to bonding cathode plate 16 to front spacers 26. Conductive leads 42 and faceplate conductors 44 can be produced by one of many suitable techniques, including screen printing, thick-film application, patterned evaporation, etc.

After applying phosphor coating 32 to rear surface 18, cathode plate 16 is bonded or attached to front spacers 26. The portions of faceplate conductors 44 which extend over front spacers 26 engage complementary die bond pads on the active surface of cathode plate 16 to form effective electrical conductive paths to the emitter circuits. In the embodiment of FIGS. 1–4, cathode plate 16 is bonded to faceplate 12 by compressing the two components toward each other while heating them to the bonding temperature of the glass frit used to form spacers 26.

Backplate 14 is then prepared by forming rear positioning spacers 27 on its front surface in a manner similar or identical to the formation of front positioning spacers 26. Spacers 26 and 27 are illustrated as identical structures in spatial registry with one another, but such identity is not essential to the present disclosure. Spacers 26 and 27 can have different sizes and relative locations about the respective backplate 14 and faceplate 12, depending upon the structural requirements and physical arrangement of a specific display. Getter 38 and conductive lead 40 are provided as described above after forming spacers 27. Alternatively, a non-evaporable getter could be used, in which no conductive lead would be required. Activation of this type of getter would occur during the high temperatures used during seal formation.

After forming rear spacers 27 and providing getter 38, peripheral spacer 22 is formed by extruding or otherwise applying a stiff glass frit paste to the front surface of backplate 14 about the intended path of peripheral spacer 22. The glass frit used for production of the peripheral seal 22 can either be a vitreous frit or a devitrifying frit. The critical physical property required in this frit is that it must vitrify at a firing temperature that is lower than the softening temperature of the frit used to form spacers 26 and 27. The frits chosen for use in producing the spacers must also have coefficients of expansion substantially matching that of the glass within backplate 14 and faceplate 12.

Backplate 14 is next moved into a position behind cathode plate 16. Bonding pressure is then applied to urge backplate 14 and faceplate 12 toward one another and intervening cathode plate 16 while heating the assembly to the firing temperature of the glass frit used to form peripheral spacer 22. This step normally takes place within a vacuum chamber maintained at the intended interior vacuum pressure for the display, but vacuum pressure could be subsequently achieved within the display by access through a sealable tube or other opening leading through the fired seal structure.

Depending upon the nature of the getter 38, it might be activated by the application of heat required to fire the peripheral spacer 22. It also might be activated by heat generated by application of electrical current through conductive leads 40 after assembly has been completed, or by RF energy.

Firing of the glass frit within the peripheral spacer 22 does not affect the previously-formed bonds at the respective ends of front spacers 26, since spacers 26 will not be heated to their softening temperature. Thus, the critical spacing between faceplate 12 and cathode plate 16 can be maintained during the formation of the glass peripheral spacer 22.

No bond is required between rear spacers 27 and the backside of cathode plate 16, since the purpose of spacers 27 is simply to locate backplate 14 and cathode plate 16 in spaced parallel positions at a distance that is not critical to display operation.

Figure 5:
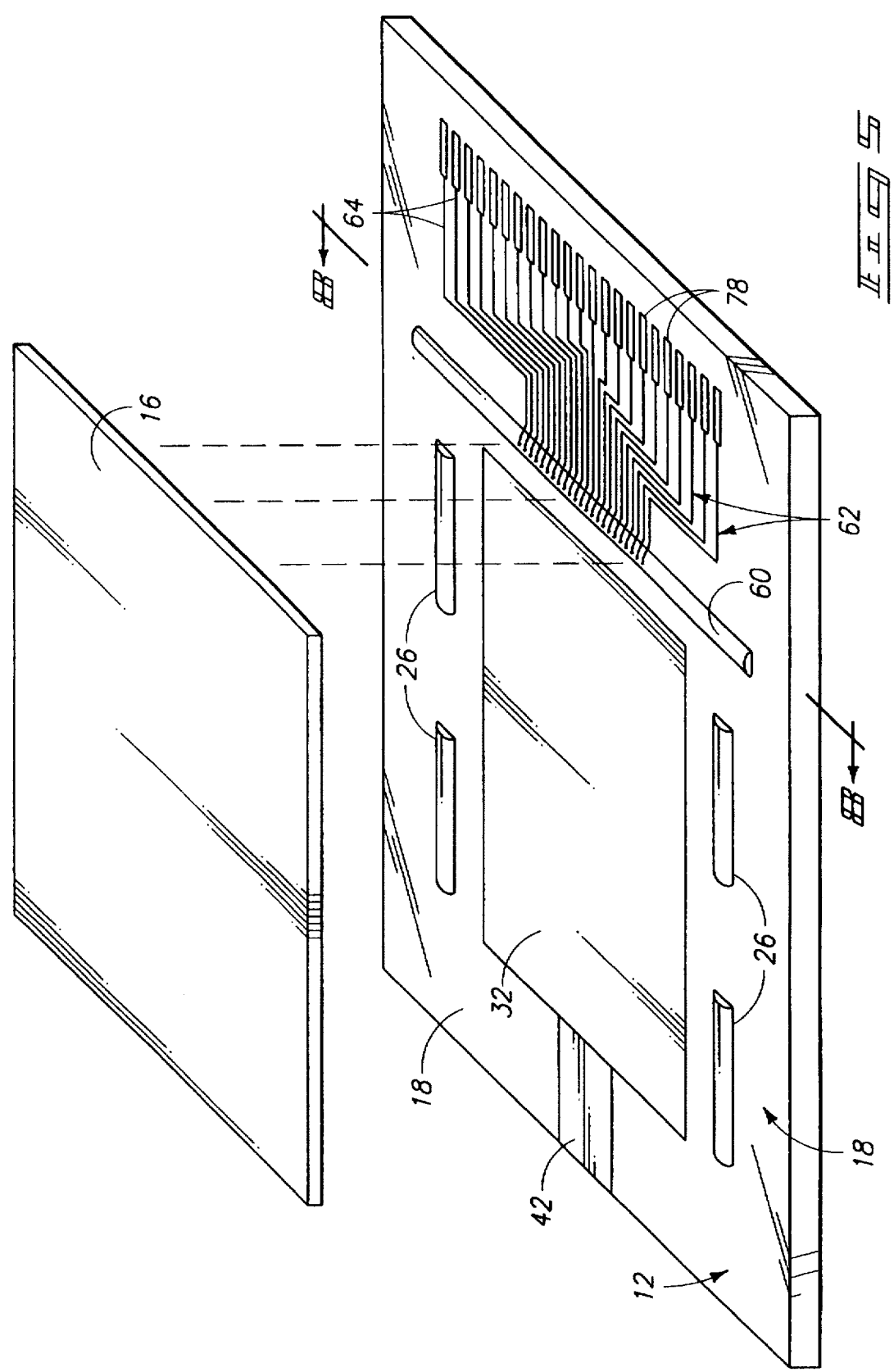
FIG. 5 is a simplified exploded perspective view of a subassembly in accordance with the invention which includes a faceplate and a silicon cathode plate.

FIGS. 5–8 shows an improved structure for forming mechanical and electrical connections between the cathode plate and the faceplate, and for spacing the cathode plate from the faceplate. FIG. 5 shows cathode plate 16 positioned over transparent faceplate 12 prior to bonding the two elements. Faceplate 12 includes phosphor screen 32, a conductive lead 42, and a plurality of front positioning spacers 26 as discussed above. In addition, faceplate 16 includes an elevated and screen-printed dielectric layer or connector ridge 60 and a plurality of screen-printed faceplate terminal conductors 62 overlying faceplate rear surface 18.

Connector ridge 60 is an elongated platform formed along faceplate rear surface 18 by conventional thick-film stenciling or screen printing techniques with a dielectric material such as a devitrifying frit. It is preferably formed simultaneously with forming front positioning spacers 26. However, positioning spacers 26 have greater thicknesses than connector ridge 60. Specifically, connector ridge 60 is formed with a thickness of about one mil less than that of positioning spacers 26. Typically, the positioning spacers will have a thickness of about eight mils and the connector ridge will have a thickness of about seven mils.

Figure 6:
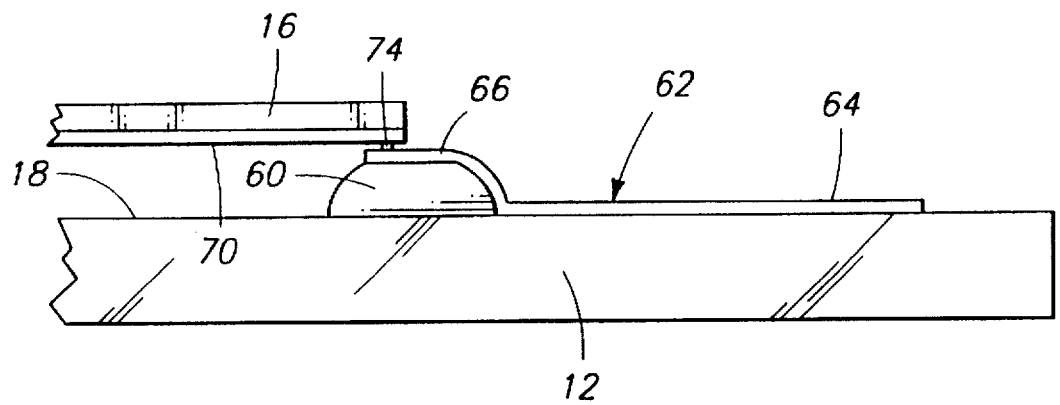
FIG. 6 is a partial cross-sectional view of the subassembly shown in FIG. 5, showing a faceplate connector ridge and associated connection circuitry. The faceplate and cathode plate are shown in their assembled positions.

Faceplate terminal conductors 62 are conductive metal traces having lower-level base portions 64 and upper-level connecting portions 66 (FIG. 6). Base portions 64 are positioned directly over faceplate rear surface 18 while connecting portions 66 are positioned atop and overly connector ridge 60. Terminal conductors 62 are preferably formed by screen printing, using conventional thick-film multi-layer technology.

Cathode plate 16 has a plurality of emitter or electrode conductors 70 on or adjacent its front emitter surface 25. These conductors are electrically connected to individual emitters or electrodes of cathode plate 16. In most cases, the electrical connection between the conductors and the emitters will be through multiplexing circuitry (not shown) on cathode plate 16. Emitter conductors 70 are preferably spaced at intervals of no more than 0.025 inches.

Each emitter conductor 70 terminates in a die bond pad 72 on or adjacent an outer edge of front emitter surface 25. Cathode plate 16 is positioned over connector ridge 60 for electrical contact between cathode plate 16 and connecting portions 66 of terminal conductors 62. Die bond pads 72 face faceplate 12 and are aligned with connecting portions 66 of faceplate terminal conductors 62.

A plurality of conductive metal bonds are formed by deformable metal bumps 74 which are interposed between faceplate rear surface 18 and cathode plate 16. The metal bumps form individual electrical connections between faceplate 12 and cathode plate 16. Metal bumps 74 are formed in accordance with conventional bumping techniques between terminal conductor connecting portions 66 and cathode plate bond pads 72. Cathode plate 16 is pressed against faceplate 12 to smash metal bumps 74 and to thereby form the conductive bonds. Metal bumps 74 also form physical bonds when used in this manner. This process, used in other applications within the semiconductor industry, is referred to as flip-chip technology. The conductive and physical bonds described above are therefore alternatively referred to as conductive flip-chip bonds. Heat is sometimes used in conjunction with pressure to form the bonds. Flip-chip technology also includes precision alignment equipment which is advantageously used to align die bond pads 72 with terminal conductors 62 and to align emitter tips on cathode plate 16 with appropriate phosphor pixels on faceplate 12 before cathode plate 16 is pressed against faceplate 12. Two or more alignment dots are printed on each of cathode plate 16 and faceplate 12 to facilitate this process in accordance with conventional flip-chip techniques.

A number of unique methodical steps are used to fabricate the structure described above. Such steps include mounting cathode plate 16 to luminescent faceplate 12 at a spaced distance from faceplate rear surface 18 and subsequently affixing backplate 14 to faceplate 12 behind cathode plate 16. Further steps include spacing backplate 14 rearward from faceplate 12 to create an internal space between backplate 14 and faceplate 12. The internal space contains the cathode plate and creates a rearward vacuum space behind cathode plate 16. The invention also includes providing a getter in the rearward vacuum space and, finally, evacuating the internal space between the backplate and luminescent faceplate.

Mounting cathode plate 16 to faceplate 12 is accomplished through the flip-chip or metal bumping technology described above. Preferable steps include forming front positioning spacers 26 on faceplate rear surface 18 and simultaneously forming one or more dielectric connector ridges 60 on faceplate rear surface 18. Further steps include screen printing a plurality of conductive traces, referred to herein as faceplate terminal conductors 62, overlying faceplate rear surface 18 and extending over connector ridge 60.

Conductive bonds between terminal conductors 62 and emitter conductors 70 are formed by providing metal bumps 74 between connecting portions 66 and cathode plate bond pads 72 prior to pressing cathode plate 16 against faceplate 12. Metal bumps 74 can be formed on either upper-level connecting portions 66 or die bond pads 72. The metal bumps form the conductive bonds between the die bond pads of the cathode plate and the terminal conductors of the faceplate as a result of pressing the cathode plate against the faceplate.

The conductive metal bonds form individual electrical connections between the terminal conductors and the die bond pads of the cathode plate, as well as forming adhesion connections or bonds between the faceplate and cathode plate to mount the cathode plate to the faceplate. This eliminates the need for heating spacers 26 to their melting point during assembly. The conductive bonds provide both mechanical and electrical connections between faceplate 12 and cathode plate 16.

Faceplate terminal conductors 62 extend outward on rear surface 18, beneath and beyond the peripheral spacer 22 discussed with reference to FIGS. 1–4, to external connector pads 78 (FIG. 5). These pads are accessible outside of the evacuated internal space of the flat-panel display. Being electrically connected to the emitter conductors of the cathode plate, they provide convenient points of electrical connection between the cathode plate and external driver circuitry.

Figure 9:
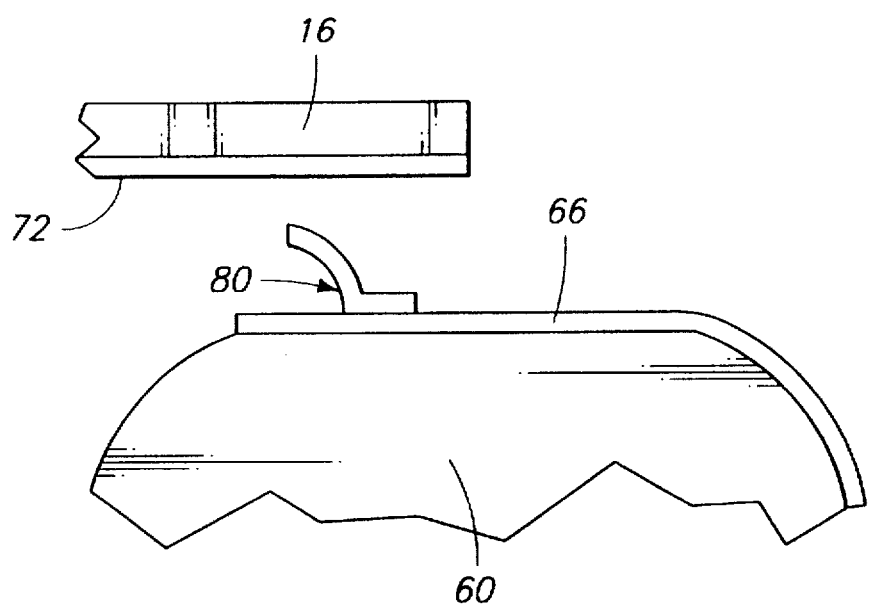
FIG. 9 is an enlarged cross-sectional view similar to FIG. 6, illustrating an improved method of providing electrical connections between a faceplate and a cathode plate. The faceplate and cathode plate are shown in positions prior to assembly.
Figure 10:
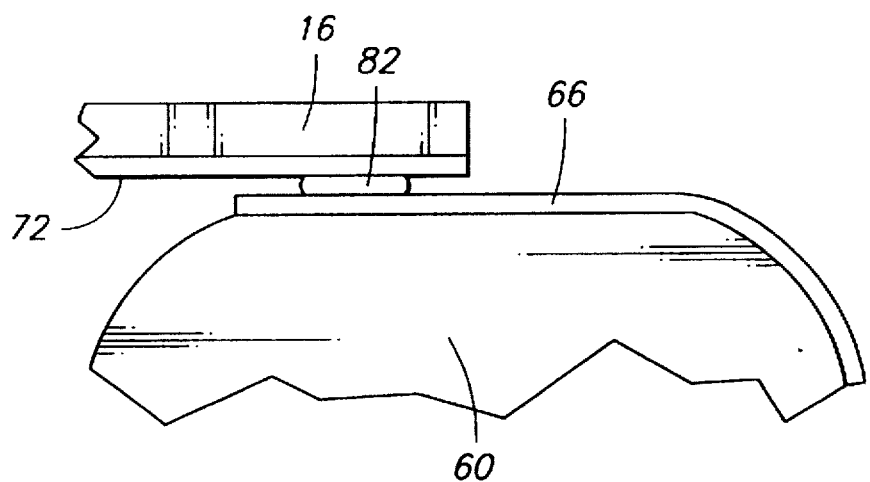
FIG. 10 is an enlarged cross-sectional view such as shown in FIG. 9, except that the faceplate and cathode plate are shown after assembly.

FIGS. 9 and 10 show an alternative structure and method which is preferably used to create flip-chip connections or bonds between the faceplate and the cathode plate. The alternative method utilizes a conventional wire bonder or wire bonding machine. Generally, the method comprises bonding stubs of bond wire either to upper-level connecting portions 66 of faceplate terminal connectors 62 or to die bond pads 72 of cathode plate 16. The bond wire stubs have projecting tails of bond wire which are interposed between and bonded to faceplate terminal connectors 62 and to die bond pads 72 to form conductive flip-chip bonds therebetween.

More specifically, the alternative method comprises adjusting a wire bonder's tear length to a setting which leaves a projecting tail of severed bond wire at terminating wire bond connections. The projecting tail is preferably about two microns in length. Subsequent steps include making wedge bonds to connecting portions 66 of individual faceplate terminal conductors 62 with bond wire from the wire bonder. Such bonds could alternatively be made to cathode plate bond pads 72. Further preferred steps include abbreviating the wire bond connections by severing the bond wire adjacent said individual connecting portions or die bond pads, thereby leaving projecting tails or stubs 80 of severed bond wire which project from said individual connecting portions or die bond pads. Projecting tails 80 are a result of the adjusted tear length of the wire bonder. They form conductive bonds 82 (FIG. 10) between the cathode plate bond pads 72 and connecting portions 66 of terminal conductors 62 after cathode plate 16 is pressed against faceplate 12.

Projecting wire stubs 80 can be formed as described above with a Model 1470 wire bonding machine, made by Kulicke and Soffa Inc., of Willow Grove, Pa. Aluminum wire having a diameter of about 0.00125 inches, with approximately 1% silicon, is one example of a suitable bonding wire.

It has been found that forming the abbreviated wedge bond connections described above result in compression and deformation of bonding wire within the bonding wedge of the wire bonding equipment. While this is a normal occurrence, the deformation is not allowed to clear the bonder wedge during repeated abbreviated connections because of the unusually short length of bonding wire which is allowed to pass through the wedge at each connection. Each subsequent abbreviated connection aggravates and compounds the deformation, until the wire eventually sticks or jams within the bonder wedge. This anomaly can be solved by interposing a normal point-to-point wire bond connection between each abbreviated connection. In the preferred embodiment described above, the wire bonder is programmed to alternate between forming individual bonded stubs or tails 80 and individual wire bond interconnections 68.

In practice, it is impractical to print terminal conductors 62 over the abrupt elevational change presented by connector ridge 60 as shown in FIG. 6 using conventional screen printing technology. A conventional solution to the problem of connecting between multi-level conductors is shown in FIG. 11. FIG. 11 shows a conventional multi-level interconnect structure 100, used to provide inter-level connections between faceplate 12 and cathode plate 16.

Multi-level interconnect structure 100 has faceplate terminal conductors which are formed by a plurality of lower-level screen-printed conductors or conductor base portions 102 and a plurality of upper-level screen-printed conductors or connecting portions 104. Upper-level conductors 104 are applied atop a dielectric spacer or connector ridge 106. Lower-level conductors 102 are applied directly over faceplate rear surface 18 for connection to external devices. Lower-level conductors 102 extend laterally beneath upper-level conductors 104. Dielectric spacer 106 is interposed vertically between lower-level conductors 102 and upper-level conductors 104. Via conductors 108 extend vertically through dielectric spacer 106 to provide electrical connection between lower-level conductors 102 and upper-level conductors 104.

Forming this type of multi-level interconnect structure requires a number of steps. First, lower-level conductors 102 must be applied to faceplate rear surface 18. Next, dielectric spacer 106 is printed and fired over faceplate rear surface 18 so that it extends at least partially over lower-level conductors 102. Areas which will subsequently become vias must be masked. Additionally, forming dielectric spacer 106 usually requires two or more similar printing and firing steps, with each step using a different screen size and orientation. Then conductive via material is printed and fired to form via conductors 108. Finally, upper-level conductors 104 are printed and fired atop dielectric spacer 106 for contact with via conductor 108. A total of at least five printing and firing steps is thus required using this methodology.

Figure 12:
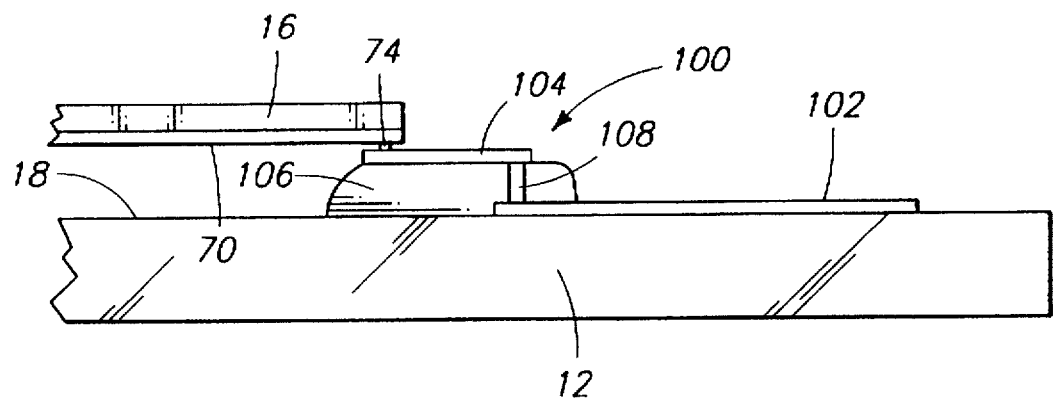
FIG. 12 is a simplified exploded perspective view of preferred subassembly such as shown in FIG. 5. However.
Figure 13:
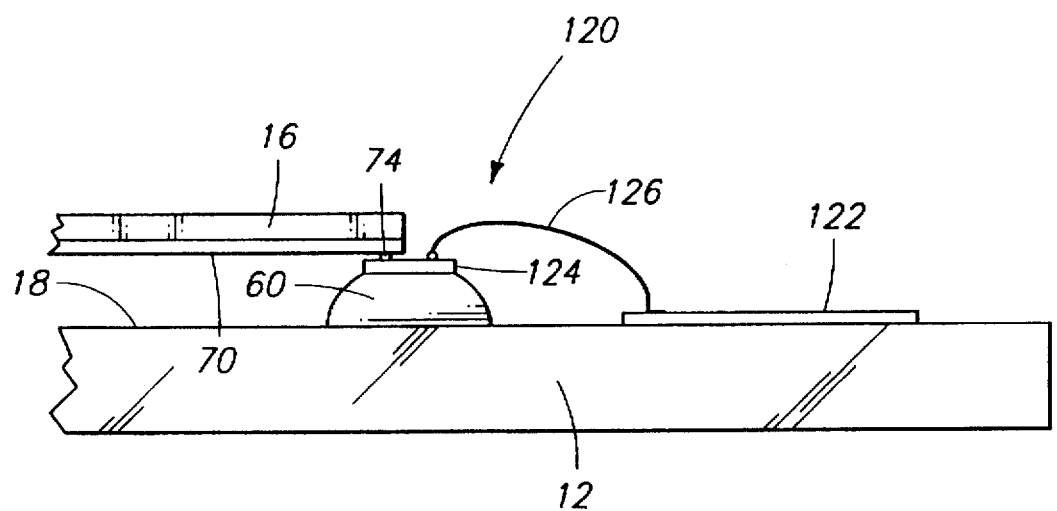
FIG. 13 shows a faceplate connector ridge and associated connection circuitry in accordance with the preferred manner of forming faceplate conductors as illustrated in FIG. 12.
Figure 12:
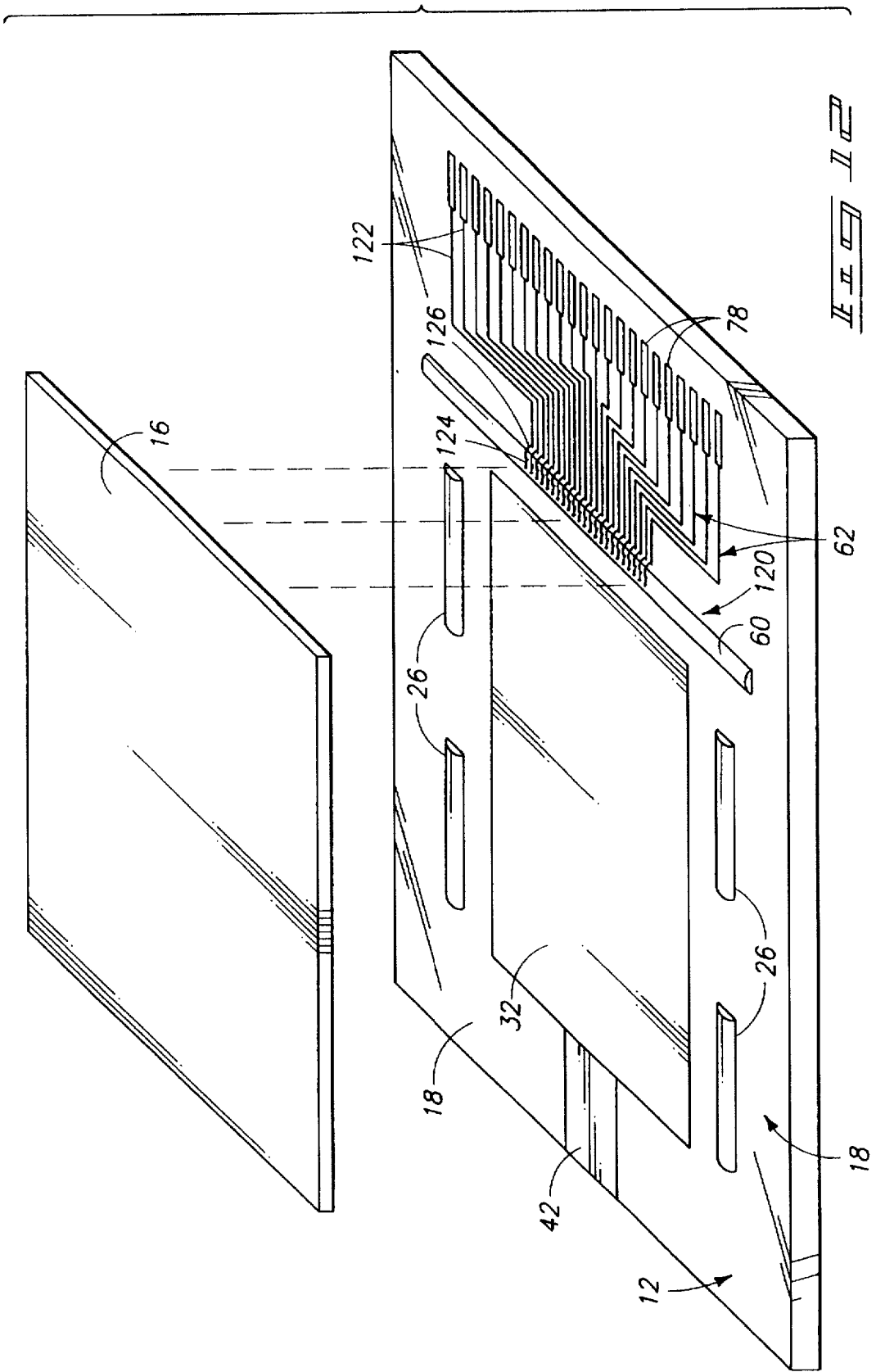

FIGS. 12 and 13 show a subassembly comprising faceplate 12 and cathode plate 16, similar to that shown in FIG. 5. However, the subassembly utilizes an alternative multilayer interconnect structure 120 which reduces and simplifies the fabrications previously required to form a multi-level interconnect structure. The interconnect structure includes dielectric layer or connector ridge 60, screen-printed as described above with conventional thick-film multi-layer processes. A plurality of faceplate terminal conductors 62 are formed of two discrete conductor levels or portions, referred to as lower-level conductors or base portions 122 and upper-level conductors or connecting portions 124. Lower-level conductors 122 are screen-printed at a first elevation directly over the substrate formed by faceplate 12. Upper-level conductors 124 are simultaneously screen-printed over connector ridge 60. Upper-level conductors 124 are thus printed at a second elevation which is greater than the first elevation of lower-level conductors 122. Both lower-level conductors 122 and upper-level conductors 124 are formed after formation of dielectric connector ridge 60.

Lower-level conductors 122 and upper-level conductors 124 of individual faceplate terminal conductors 62 are separated by a non-conducting gap, necessitated by the difficulty or impracticality of screen printing over the abrupt elevational change presented by connector ridge 60. This gap extends both horizontally and vertically. However, the lower-level and upper-level conductors are electrically connected to each other by a plurality of bond wire interconnections 126. Each bond wire interconnection 126 is a length of bond wire which extends between an individual lower-level conductor 122 and its corresponding individual upper-level conductor 124. Each bond wire interconnection 126 is connected and anchored at each of its respective ends by a ball bond or wedge bond. Conventional wire bonding equipment is used to create the bond wire interconnections.

Figure 7:
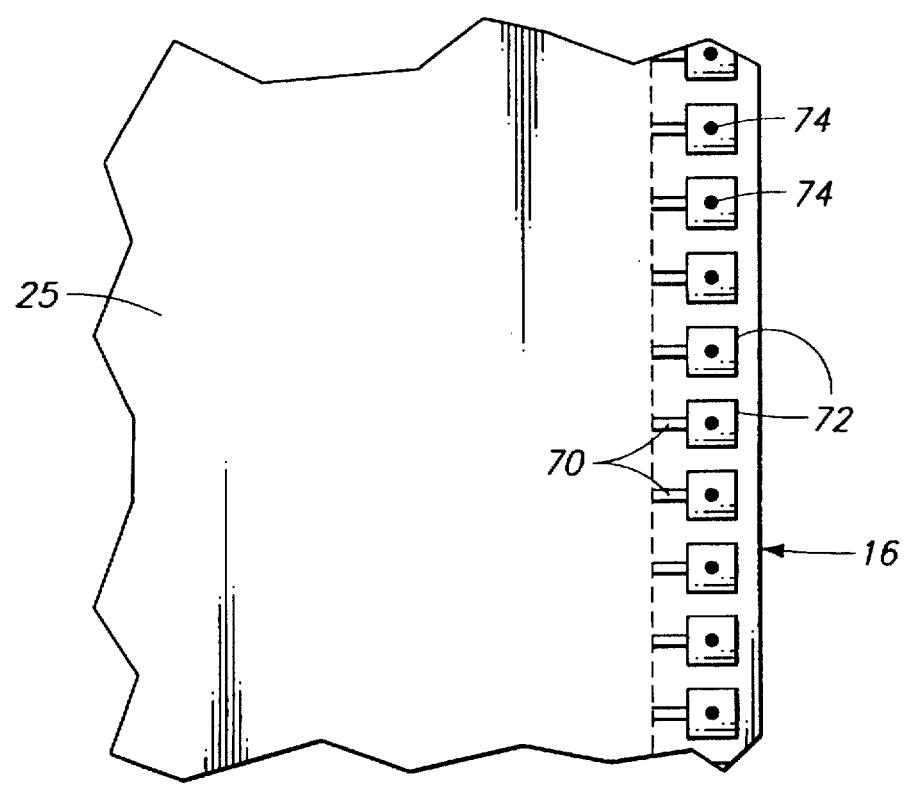
FIG. 7 is a partial front view of the cathode plate shown in FIG. 5.
Figure 8:
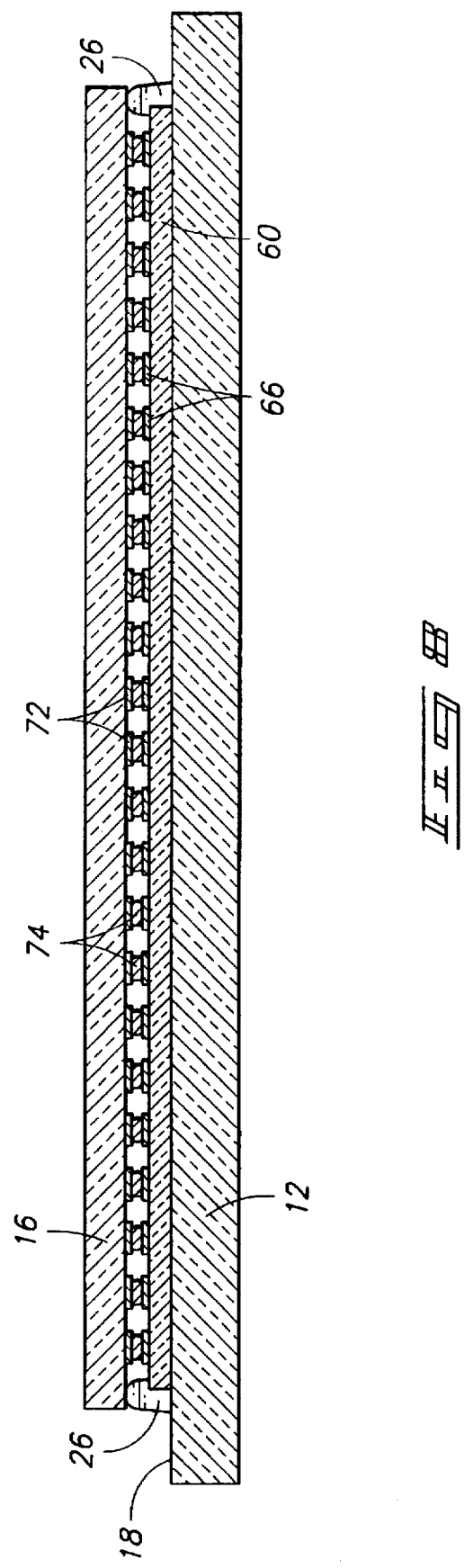
FIG. 8 is a sectional end view of the cathode plate and faceplate of FIG. 5, taken along the line 8—8 of FIG. 5. The faceplate and cathode plate are shown in their assembled positions.

Cathode plate 16 has die bond pads 72, such as shown in FIG. 7, which face faceplate 12 and which are aligned with individual upper-level conductors 124. A plurality of conductive metal bumps or flip-chip connections are positioned as described with reference to FIG. 7 between die bond pads 72 and upper-level conductors 124 to form conductive bonds therebetween.

The preferred embodiment of the invention thus includes methods of fabricating multi-layer electrical interconnection structures. Such methods include first screen printing a dielectric layer such as connector ridge 60 over a substrate such as faceplate 12. Further methods include screen printing upper and lower layers or levels 122 and 124 of conductors over faceplate 12. Lower-level conductors 122 are printed at a first elevation, directly on faceplate 12. Upper-level conductors 124 are printed at a second elevation atop dielectric connector ridge 60. The methods further include wire bonding between individual screen-printed conductors of the upper and lower levels to create inter-level electrical connections between said individual screen-printed conductors of the upper and lower levels.

Further preferred steps in accordance with the invention include conductively bonding die bond pads 72 to individual upper-level conductors 124. More specifically, cathode plate 16 is mounted and connected to faceplate 12 by (a) positioning cathode plate 16 over faceplate 12; (b) aligning die bond pads 72 to individual upper-level screen-printed conductors 124; (c) forming conductive metal bumps 74 between the aligned die bond pads 72 and said individual upper-level screen-printed conductors 124; and (d) pressing cathode plate 16 against faceplate 12.

Conductive bumps 74, also referred to as flip-chip connections, form conductive bonds between the aligned die bond pads 72 and the individual upper-level screen-printed conductors 124. Conductive bumps 74 can be formed by conventional flip-chip bumping techniques or by the techniques described above with reference to FIGS. 9 and 10, in which projecting tails of bonding wire form conductive bonds between the aligned die bond pads and the individual upper-level screen-printed conductors.

The wire bonding step described above eliminates many steps which are otherwise required to form via conductors using prior art technology. Using the methods described, only three steps are used: (a) a dielectric print; (b) a conductor print; and (c) a wire bonding step. Not only is the number of steps reduced, but the remaining steps are simpler than many of the steps required to form via conductors. The resulting structure, furthermore, avoids the problems which are inherent with via technology, such as pin-hole shorting and micro-crack leakage.

Figure 15:
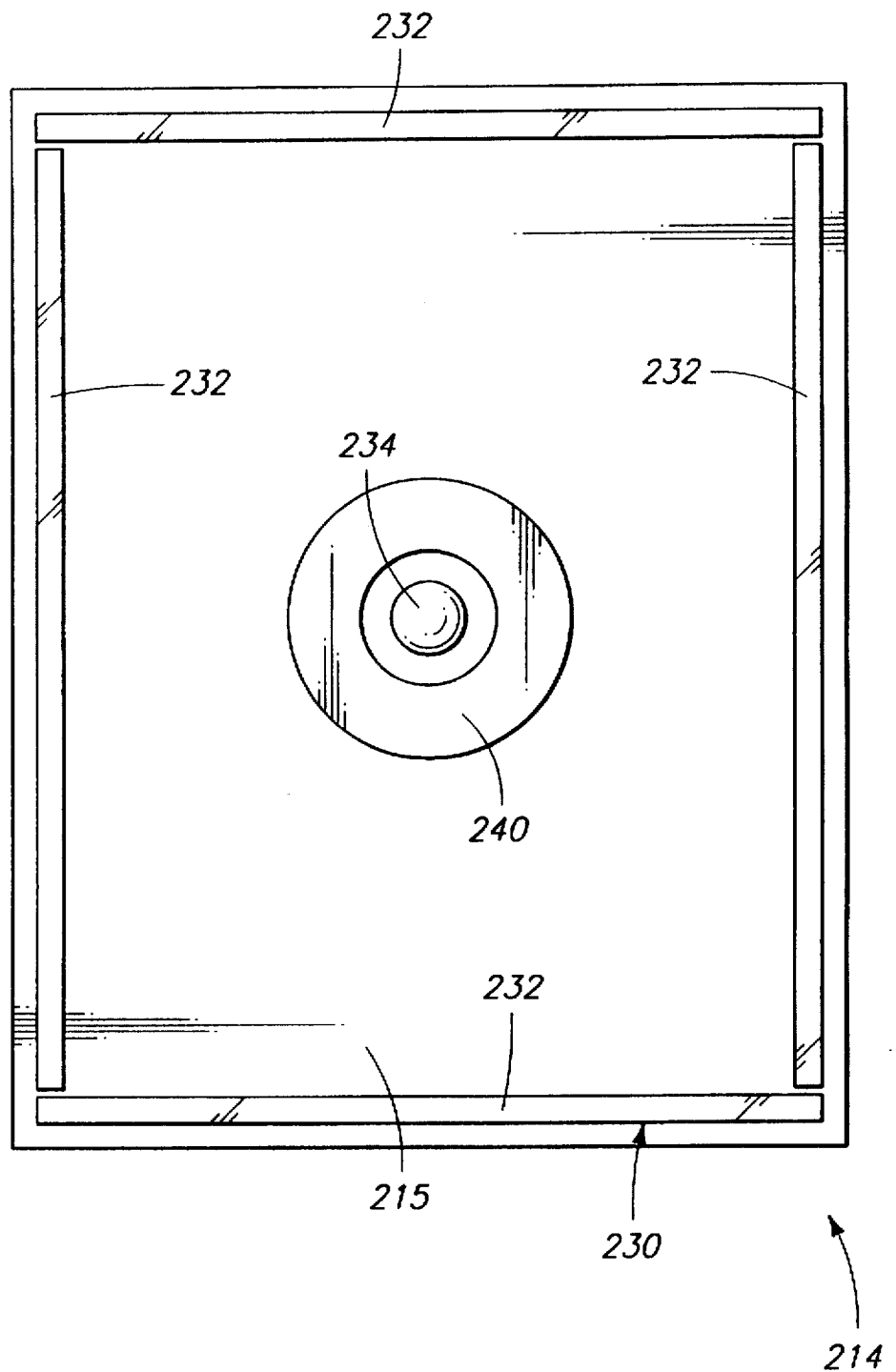
FIG. 15 is a view of the front surface of a backplate to be used in conjunction with the subassembly shown in FIG. 14.
Figure 16:
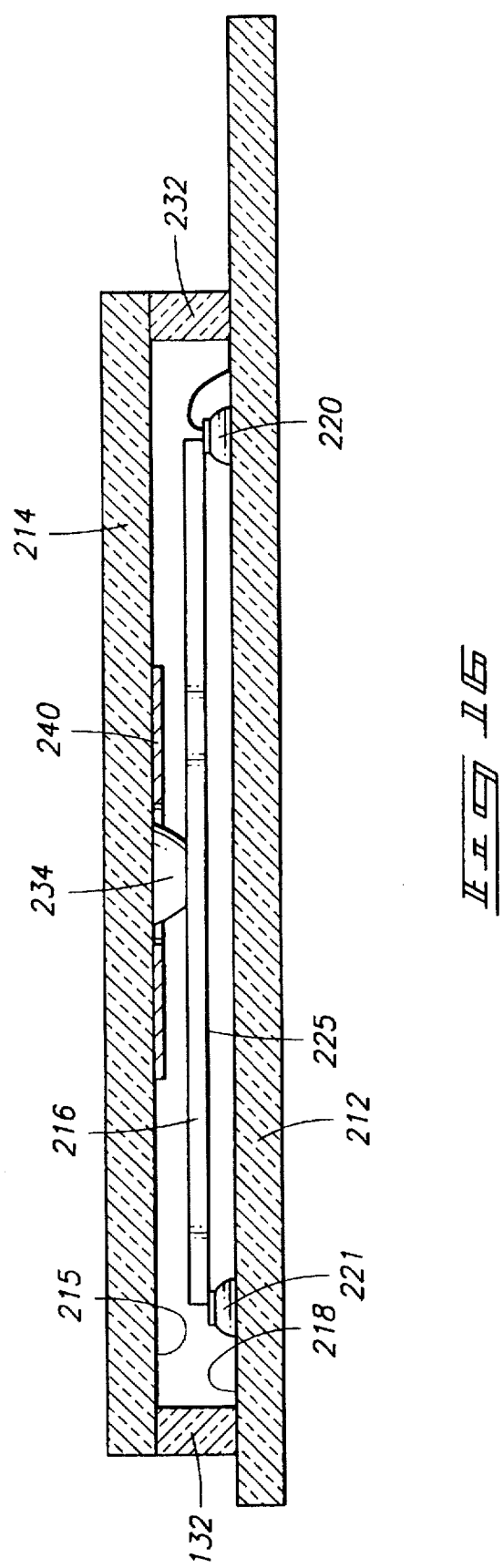
FIG. 16 is a cross-sectional view showing the backplate of FIG. 15 assembled with the subassembly of FIG. 14 in accordance with the invention.

FIGS. 14–16 show components of a flat-panel field emission display in accordance with an alternative embodiment of the invention. The flat-panel display generally includes a transparent faceplate 212, a backplate 214 (FIG. 16), and a cathode plate 216 positioned between faceplate 212 and backplate 214. These components are the same as those discussed above except as otherwise noted. Backplate 214 is made from glass in a rigid and planar form. It has a front surface 215. Cathode plate 216 is formed from a silicon substrate. It has an emitter matrix (not shown) formed on a front surface 225.

Faceplate 212 is made from glass in a rigid and planar form. It has a rear surface 218. Rear surface 218 has a cathodoluminescent area 219 which is coated with phosphor. Underlying the phosphor is a conductive layer 217 of transparent material such as indium oxide, tin oxide, or indium tin oxide (layers 217 and 219 are shown only in FIG. 14). This conductive layer can extend beyond cathodoluminescent area 219, but must be patterned so that it does not underlie subsequently applied conductors.

Faceplate 212 is prepared for mating with cathode plate 216 by forming a pair of elevated connector ridges 220 and 221 on rear surface 218. Each connector ridge is an elevated platform formed by conventional thick film stenciling or screen printing techniques with a dielectric material. The ridges are preferably polished after their initial formation to leave a relatively flat surface on their peaks.

In the preferred embodiment, connector ridges 220 and 221 are about ten thousandths of an inch high after polishing. They are formed of a devitrifying glass frit which has a relatively high melting or softening point after firing, so that they are not affected by subsequent processing steps. Connector ridges 220 and 221 could alternatively be integrally formed with faceplate 212 by molding or extrusion.

Outlining strips 222 and 224 are formed over conductive layer 217 along lines corresponding in position to the eventual position of the outer periphery of cathode plate 216. These strips are formed by stenciling and firing the same material used to form connector ridges 220 and 221. However, they have a height which is significantly less than connector ridges 220 and 221. Specifically, outlining strips 222 and 224 are about one thousandth of an inch thick and about 0.020 inches or more wide. The purpose of these strips is to reduce or eliminate electron emissions from the sharp peripheral edges of cathode plate 216 toward conductive layer 217.

A plurality of faceplate terminal conductors 226 are formed to overlie faceplate rear surface 218. Conductors 226 are formed as already described with reference to FIG. 6. Faceplate terminal conductors 222 have portions which extend over at least one of connector ridges 220 and 221. In the embodiment shown, terminal conductors 222 have connecting portions 228 which extend over connector ridge 220.

Distinct from the terminal conductors 226, faceplate 212 has a set of connecting portions 229 which lie atop connector ridge 221. These connecting portions are present only for purposes of physically bonding cathode plate 216 to faceplate 212, and not necessarily for electrical connections. Connecting portions 229 correspond generally in size and spacing to connecting portions 228 of terminal conductors 226.

Cathode plate 216 has bond pads as shown in FIG. 7 corresponding to connecting portions 228 of conductors 226. These bond pads connect to emitters and associated circuitry on cathode plate 216. Cathode plate 216 has a similar set of bond pads corresponding to connecting portions 229. Again, these bond pads are for subsequent physical bonding, and not for any necessary electrical connections.

Cathode plate 216 is bonded to faceplate 212 with flip-chip connections between the bond pads of cathode plate 216 and connecting portions 228 and 229. The flip-chip connections are implemented as already shown and described with reference to FIGS. 9 and 10.

This bonding of cathode plate 216 to faceplate 212 differs from the embodiment of FIGS. 5–8 primarily in that no separately-formed front positioning spacers are used. It has been found that connecting ridges 220 and 221 provide sufficient support to act as positioning spacers and to eliminate the need for further front spacers. The connecting ridges themselves establish the desired spacing between the faceplate and the cathode plate. This is possible, at least in part, because of the unique arrangement of faceplate, cathode plate, and backplate, in which the cathode plate is not subject to any differential pressure between its front and rear surfaces.

Backplate 214 is prepared by forming a rear peripheral positioning spacer 230 on front surface 215 (FIG. 15). Spacer 230 is sized and positioned to extend along the peripheral edges of backplate 214, and to completely surround cathode plate 216. Rear positioning spacer 230 is formed by bonding four thin glass strips 232 in a rectangular shape to the front surface 215 of backplate 214. Glass strips 232 preferably have cross-wise dimensions of about 0.040 inches by 0.1 inches. They are bonded to front surface 215 by a fired high temperature frit—preferably the same frit used to form connector ridges 220 and 221. This frit is also applied at the abutments of the strips to fill any gaps.

A peripheral seal is then formed in combination with glass strips 232 by applying a devitrifying or vitreous glass sealing frit (not shown) which adheres to the glass strips. This frit should have a softening temperature which is no greater than the vitrifying temperature of the frit used to form connector ridges 220 and 221. The frit is commonly applied as a paste. A bead or lump 234 of such paste is also applied to the central portion of front surface 215, within the area bounded by glass strips 232. Backplate 214 is then glazed in order to solidify the sealing frit and frit bead 234. This causes the frit to adhere to the underlying glass and to solidify, but does not cause the frit to fuse.

Evaporable getter material 240 is then applied or positioned around frit bead 234. In the embodiment shown, the getter material is in the form of a flat ring which surrounds frit bead 234.

Backplate 214 and the subassembly comprising faceplate 212 and cathode plate 216 are then bonded to each other. This bonding takes place in a vacuum chamber at the intended interior vacuum pressure for the display. The sealing frit material of backplate 214 is pressed against the periphery of the faceplate's rear surface 218, and the components are heated to first soften and then to vitrify the sealing frit and frit bead 234. The getter behind cathode plate 216 is activated during this process by the applied heat. This process results in the assembled structure of FIG. 16, in which cathode plate 216 is contained within an evacuated chamber bounded by glass strips 232, faceplate 212, and backplate 214. Frit bead 234 acts as a back spacer or support for cathode plate 216. The faceplate, backplate, and peripheral seal thus define an evacuated space which contains the cathode plate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A multi-layer electrical interconnection structure comprising:
   a substrate;
   a plurality of conductors which are screen printed over the substrate, the screen-printed conductors having upper-level portions and lower-level portions;
   a plurality of bond wire interconnections extending between the upper-level portions and the lower-level portions of individual screen-printed conductors, the bond wire interconnections creating inter-level electrical connections between the upper-level and lower-level portions of said individual screen-printed conductors; and further comprising:
   a semiconductor die positioned over the substrate, the semiconductor die having die bond pads which face the substrate, the die bond pads being aligned with the upper-level portions of said individual screen-printed conductors; and
   conductive bonds between the aligned die bond pads and the upper-level portions of said individual screen-printed conductors.

2. A multi-layer electrical interconnection structure comprising:
   a substrate;
   a plurality of conductors which are screen printed over the substrate, the screen-printed conductors having upper-level portions and lower-level portions;
   a plurality of bond wire interconnections extending between the upper-level portions and the lower-level portions of individual screen-printed conductors, the bond wire interconnections creating inter-level electrical connections between the upper-level and lower-level portions of said individual screen-printed conductors; and further comprising:
   a semiconductor die positioned over the substrate, the semiconductor die having die bond pads which face the substrate, the die bond pads being aligned with the upper-level portions of said individual screen-printed conductors; and
   conductive metal bumps between the aligned die bond pads and the upper-level portions of said individual screen-printed conductors, the conductive metal bumps forming conductive bonds between the aligned die bond pads and the upper-level portions of said individual screen-printed conductors.

3. A multi-layer electrical interconnection structure comprising:
   a substrate;
   a screen-printed dielectric layer over the substrate;
   a lower level of screen-printed conductors over the substrate at a first elevation;
   an upper level of screen-printed conductors overlying the screen-printed dielectric layer at a second elevation which is greater than the first elevation;
   a plurality of bond wire interconnections extending between individual screen-printed conductors of the upper and lower levels, the bond wire interconnections creating inter-level electrical connections between said individual screen-printed conductors of the upper and lower levels; and further comprising a semiconductor die having a plurality of die bond pads facing the substrate and aligned with individual upper-level screen-printed conductors, the die bond pads being conductively bonded to said individual upper-level screen-printed conductors.

4. A multi-layer electrical interconnection structure comprising:

a substrate;

a screen-printed dielectric layer over the substrate;

a lower level of screen-printed conductors over the substrate at a first elevation;

an upper level of screen-printed conductors overlying the screen-printed dielectric layer at a second elevation which is greater than the first elevation;

a plurality of bond wire interconnections extending between individual screen-printed conductors of the upper and lower levels, the bond wire interconnections creating inter-level electrical connections between said individual screen-printed conductors of the upper and lower levels; and further comprising:

a semiconductor die having a plurality of die bond pads facing the substrate and aligned with individual upper-level screen-printed conductors; and a plurality of conductive metal bumps between the aligned die bond pads and individual upper-level screen-printed conductors, the conductive metal bumps forming conductive bonds between the die bond pads and said individual upper-level screen-printed conductors.

5. A multi-layer electrical interconnection structure comprising:

a substrate;

a screen-printed dielectric layer over the substrate;

a lower level of screen-printed conductors over the substrate at a first elevation;

an upper level of screen-printed conductors overlying the screen-printed dielectric layer at a second elevation which is greater than the first elevation;

a plurality of bond wire interconnections extending between individual screen-printed conductors of the upper and lower levels, the bond wire interconnections creating inter-level electrical connections between said individual screen-printed conductors of the upper and lower levels; and further comprising:

a semiconductor die having a plurality of die bond pads facing the substrate and aligned with the individual upper-level screen-printed conductors; and a plurality of flip-chip connections between the die bond pads and said individual upper-level screen-printed conductors.

6. A multi-layer electrical interconnection structure comprising:

a substrate;

a screen-printed dielectric layer over the substrate;

a lower level of screen-printed conductors over the substrate at a first elevation;

an upper level of screen-printed conductors overlying the screen-printed dielectric layer at a second elevation which is greater than the first elevation;

a plurality of bond wire interconnections extending between individual screen-printed conductors of the upper and lower levels, the bond wire interconnections creating inter-level electrical connections between said individual screen-printed conductors of the upper and lower levels; and further comprising:

a semiconductor die having a plurality of die bond pads facing the substrate; and a plurality of bond wire stubs bonded either to said individual upper-level screen-printed conductors or to the die bond pads, the bond wire stubs having projecting tails of bond wire which are interposed between said individual upper-level screen-printed conductors and the die bond pads to form conductive bonds therebetween.

7. A multi-layer electrical interconnection structure comprising:

a substrate;

a screen-printed dielectric layer over the substrate;

a lower level of screen-printed conductors over the substrate at a first elevation;

an upper level of screen-printed conductors overlying the screen-printed dielectric layer at a second elevation which is greater than the first elevation;

a plurality of bond wire interconnections extending between individual screen-printed conductors of the upper and lower levels, the bond wire interconnections creating inter-level electrical connections between said individual screen-printed conductors of the upper and lower levels; and further comprising:

a semiconductor die having a plurality of die bond pads facing the substrate;

a plurality of bond wire wedge bonds formed either on said individual upper-level screen-printed conductors or on the die bond pads; and tails of bond wire which project from the wedge bonds, the bond wire tails being interposed between said individual upper-level screen-printed conductors and the die bond pads to form conductive bonds therebetween.

8. A multi-layer interconnection structure comprising:

a substrate having a planar surface;

a connector ridge formed over the substrate;

a lower level of conductors applied over the substrate;

an upper level of conductors applied atop the connector ridge;

a plurality of bond wire interconnections between individual conductors of the upper and lower levels, the bond wire interconnections creating inter-level electrical interconnections between said individual conductors of the upper and lower levels;

a semiconductor die positioned over the connector ridge, the semiconductor die having a plurality of die bond pads facing the substrate and aligned with the upper-level conductors; and a plurality of conductive bonds between individual die bond pads and the facing upper-level conductors.

9. A multi-layer interconnection structure as recited in claim 8, the interconnection structure further comprising conductive metal bumps between said die bond pads and the facing upper-level conductors, the conductive metal bumps forming the conductive bonds.

10. A multi-layer interconnection structure as recited in claim 8, the interconnection structure further comprising a plurality of flip-chip connections forming the conductive bonds.

11. A multi-layer interconnection structure as recited in claim 8, and further comprising bond wire stubs bonded either to individual upper-level conductors or to said individual die bond pads, the bond wire stubs having projecting tails of bond wire which are interposed between said individual upper-level conductors and said individual die bond pads to form the conductive bonds.

12. A multi-layer interconnection structure as recited in claim 8 and further comprising:

a plurality of bond wire wedge bonds formed either on individual upper-level conductors or on said individual die bond pads; and tails of bond wire which project from the wedge bonds, the bond wire tails being interposed between said individual upper-level conductors and said individual die bond pads to form the conductive bonds.

* * * * *

UNITED STATES PATENT AND TRADEMARK OFFICE
CERTIFICATE OF CORRECTION

PATENT NO. : 5,760,470
DATED : June 2, 1998
INVENTOR(S) : Darryl M. Stansbury

It is certified that error appears in the above-identified patent and that said Letters Patent is hereby corrected as shown below:

Col. 1, line 18
replace "connection"
with --interconnection--.

Signed and Sealed this

Twenty-fourth Day of November, 1998

Attest:

BRUCE LEHMAN

Attesting Officer

Commissioner of Patents and Trademarks